United States Patent [19]

Burgemeister

[11] Patent Number: 4,511,783
[45] Date of Patent: Apr. 16, 1985

[54] METHOD FOR MAKING ELECTRICAL CONTACTS TO DIAMOND BY MEANS OF A LASER, AND DIAMOND PROVIDED WITH CONTACTS ACCORDING TO THIS OPTICAL METHOD

[75] Inventor: Eduard A. Burgemeister, Abcoude, Netherlands

[73] Assignee: N.V. Optische Industrie "De Oude Delft", Netherlands

[21] Appl. No.: 463,474

[22] Filed: Feb. 3, 1983

[30] Foreign Application Priority Data

Feb. 4, 1982 [NL] Netherlands .................. 8200430

[51] Int. Cl.³ .............................................. B23K 27/00
[52] U.S. Cl. ...................... 219/121 LM; 219/121 LW
[58] Field of Search ..... 219/121 L, 121 LM, 121 LE, 219/121 LF, 121 LW

[56] References Cited

U.S. PATENT DOCUMENTS 4,420,675 12/1983 Takehara .................. 219/121 LM

OTHER PUBLICATIONS

"The Properties of Diamond", ed., J. E. Field, Academic Press 1979, p. 644.
"Dosimetry with a Diamond Operating as a Resistor";, E. A. Burgemeister, 2362 Physics in Medicine and Biology, vol. 26, Mar. 1981, No. 2, pp. 269-275.
"Preparation and Characteristics of Natural Diamond Nuclear Radiation Detectors", S. F. Koxlov, IEEE Transactions on Nucleur Science, Vd. NS-22, Feb. 1975, No. 1, pp. 160-170.

Primary Examiner—C. L. Albritton

[57] ABSTRACT

A method for making electrical contacts to diamond, in which a surface layer of the diamond is transformed by means of a laser beam into graphite having a sheet resistivity in the range of 5 to 100 Ohms. The diamond to be treated and the laser beam are moved with respect to each other according to a raster pattern. The laser is operated with such a pulse width and pulse frequency, the laser beam is focussed in such a way and is moved with respect to the diamond at such a speed, that pit-like surface areas of graphite are formed which join or overlap. After the graphitization a wire or other electrical conductor is fixed to the graphite layer, through which a diamond having electrical contacts is obtained.

7 Claims, 3 Drawing Figures

METHOD FOR MAKING ELECTRICAL CONTACTS TO DIAMOND BY MEANS OF A LASER, AND DIAMOND PROVIDED WITH CONTACTS ACCORDING TO THIS OPTICAL METHOD

The invention relates to a method for making electrical contacts to diamond and relates also to a diamond provided with contacts according to this method.

When some types of diamond having semiconductor properties are used for certain applications, electrical contacts are to be fixed to the diamond. These applications include the use of diamond as detector of ionizing radiation as described in Dutch patent application No. 80.06321. A synthetic diamond, used as such a detector and polished to the shape of, for instance, a cube having edges of 0.7 mm, has a resistance higher than $10^{15}$ Ohms without radiation and $3.10^7$ Ohms when the diamond is irradiated with Gamma radiation from a Cobalt source at a dose rate of 0.02 Gy/sec. In another application type IIb diamond can be used as a thermistor having a negative temperature coefficient of nearly 6% per °C. A diamond cube having 0.7 mm edges, which is suitable for the latter application, has a resistance at room temperature of about $10^4$ Ohms. In a further application, type IIb diamond is used as light-sensitive switch.

It is known in the art to attach wires or similar electrical conductors to materials in order to obtain good electrical contacts. Conductive paint or several kinds of paste are often used for this purpose. However, when wires are attached directly to diamond having semiconductor properties by means of paint or paste, non-Ohmic contacts are formed. This is evident from the characteristics of current against voltage which firstly are strongly different upon changing the sign of the voltage, secondly are strongly non-linear and thirdly are irreproducible after changing the temperature. Such non-Ohmic contacts are also formed when metal layers are deposited on diamond having semiconductor properties, onto which metal layers subsequently wires are attached.

Yet Ohmic contacts can be formed on diamond when special metal alloys are brazed to diamond by means of certain techniques.

It is known from Phys. Med. Biol. 1981, Vol. 26, no 2, pp. 269–275 that when a wire is fixed to a graphite layer on diamond by means of paint or paste, an Ohmic contact can also be formed. An electrical contact is formed in this way which is at least of a sufficient quality for the said applications of diamond having semiconductor properties. The shape and reproducibility of the characteristics of current against voltage define the quality of the contacts.

The above mentioned layer of graphite can be formed following a method reviewed in "The Properties of Diamond", ed. J. E. Field, Academic Press 1979, page 644, whereby diamond is heated in an inert atmosphere to a temperature above 1500° C. With this method all surfaces of the diamond specimen transform to graphite whereas in practice only two opposite faces need to be provided with contacts. Therefore, the graphite has to be removed by means of polishing the side faces of such a graphitized diamond specimen. This removal should occur completely since residuals of graphite cause leakage currents along the side faces. Such residuals could be removed easily in strong acids, but the two intended layers are then also attacked. Therefore, this method for providing only two faces with layers of graphite is very laborious and moreover, a considerable part of the diamond is wasted in this way.

It is the object of the invention to obviate the said problem and to provide a method with which good electrical contacts are formed in a simple way. According to the invention this object is accomplished herein that a surface layer of the diamond is transformed by means of a laser beam to graphite having a sheet resistivity in the range of 5 to 100 Ohms and that subsequently a wire or other electrical conductor is fixed to this graphite layer.

With the said method of the invention the power density of the laser beam has to be adjusted in such a way that it is sufficiently high to melt a surface layer of the diamond crystal. Subsequently, the carbon atoms in said layer recrystallize as graphite.

With the said method it is possible to illuminate only a part of a face of the diamond and to transform this part to a graphite layer. The remaining part of the face of the diamond makes up an electrical insulating margin. The opposite face can be treated in the same way. The margins and side faces of the diamond specimen remain clean, which is especially important for the application of diamond as radiation detector. For, dirt or graphite on the margins and side faces give rise to leakage currents. These currents cause parallel resistances which disturb the operation of diamonds as radiosensitive resistors having values in the range of $10^6$ to $10^{15}$ Ohms. It is also possible to graphitize more parts of one face in order to fix more wires to one face. The method is simple and advantageous because graphite layers are formed only locally and other parts of the diamond surface remain clean. Moreover, with this method only a small part of the diamond is wasted.

The invention will be described further with reference to the drawing in which a diamond is shown with electrical contacts obtained with the optical method of the invention and in which.

The type of laser having sufficient power to process diamond, produces infra-red light which is only to a small part absorbed by diamond. Therefore, the surface of the diamond has to be painted in order to initiate the process of graphitizing. The incidence of the laser beam on the diamond surface may be perpendicular, tangential and at other angles.

At normal incidence of the laser beam the process should be carried out carefully in order to avoid fragmentation of diamond having inclusions which absorb light and thus energy. Therefore, the thermal arrangement of the diamond holder is important for adequate dissipation of the heat generated in this process.

Figure 1:
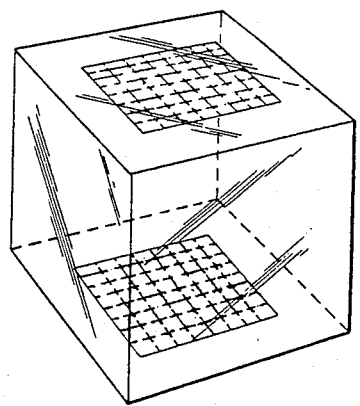
FIG. 1 illustrates a perspective view of a diamond cube having graphite layers at two opposite faces.

As shown in FIG. 1, a part of a face of the diamond may be graphitized in such a way that the remaining part forms a margin which reduces the possibility of leakage currents. In the diamond shown in FIG. 1 the top and bottom surfaces are each partly graphitized.

Upon graphitizing the surface layer of diamond by means of laser beam, various conditions of the laser can be employed. The laser can be operated continuously or in pulsed mode. The diamond to be treated and the laser beam can be moved with respect to each other at a certain speed according to a raster pattern.

One of the laser systems suitable for graphitizing diamond is for instance a Nd-YAG-pulse laser having a wavelength of 1.06 μm. The pulse width and pulse frequency of the laser are matched with the speed of the movement of the laser beam with respect to the diamond in such a way that small surface areas are transformed to small pits of graphite which join or overlap. Depending on the power of the laser, the focus of the laser beam is adjusted to a power density of the order of 3 GW.cm$^{-2}$ per pulse whereby the pits have a diameter of 10 to 50 μm and a depth of about 30 μm. The pattern of pits making up the intended surface layer of graphite is formed in this way in several seconds. The method is therefore very fast, although mounting a diamond specimen underneath the laser head takes some time.

Figure 2:
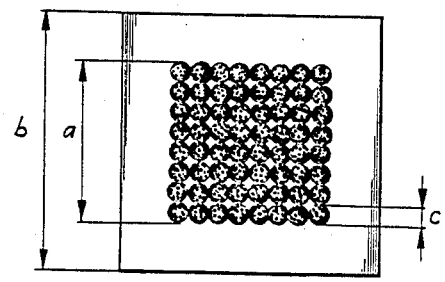
FIG. 2 illustrates a top view of the diamond specimen.

FIG. 2 shows the top face of the diamond of FIG. 1 which has been treated with a pulsating laser. The edge is b=0.7 mm, the length of the graphite layer is a=0.4 mm and the diameter of a pit of graphite is c=50 μm.

Figure 3:
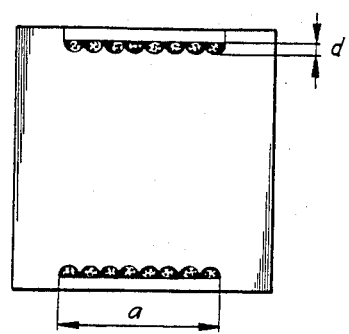
FIG. 3 illustrates a side view of the diamond specimen.

FIG. 3 shows a side view of the diamond of FIG. 1. As diamond is transparent, the graphite layer can be observed clearly in a side view. This layer is slightly submerged with respect to the original surface of the diamond. The depth of the pits is d=30 μm.

It is self-evident that the laser can be operated in such a way that a continuous and homogeneous graphite layer is formed rather than a raster of pits.

The black layer thus obtained is a part of the surface layer of diamond which is transformed to graphite and forms an inherent part of the diamond. Said part is very difficult to remove mechanically. The sheet resistivity of the layer (with reference to any square area) is in the range of 5 to 100 Ohms.

A wire or other electrical conductor is mounted with paint, paste, a spring or in other ways to the graphite layer by means of well-known techniques.

I claim:

1. A method for making electrical contacts to a diamond to be used as radiation or heat sensitive detector including the steps of
   (a). providing two different faces on the diamond,
   (b). radiating at least a part of each of said faces with a laser beam such that said parts are transformed into graphite layers with a sheet resistivity in the range of 5 to 100 ohms, and
   (c). providing an electrical connection to each of the graphite layers.

2. A method according to claim 1 wherein in step (b), relative movement of the diamond to be treated and the laser beam is according to a raster pattern.

3. The method of claim 1 wherein said diamond has semiconducting properties.

4. A method according to claim 2 wherein the laser is operated at such a pulse width and pulse frequency, the laser beam is focussed in such a way, and the relative movement of the laser and the diamond is at such a speed, that pit-like surface areas of graphite are formed which overlap.

5. A method according to claim 4 wherein the laser beam is directed substantially perpendicular to the surface of the diamond whereby substantially circular pit-like surface areas of 10 to 50 μm diameter and about 30 μm depth are formed.

6. A diamond provided with electrical contacts by means of the method according to one of claims 1, 2, 4, or 5 to be used as a radiation or heat sensitive detector.

7. A diamond according to claim 6 wherein said two different faces are positioned opposite each other.

* * * * *